United States Patent
Lee

(10) Patent No.: US 9,030,896 B1
(45) Date of Patent: May 12, 2015

(54) CONTROL CIRCUIT FOR BIT-LINE SENSE AMPLIFIER AND SEMICONDUCTOR MEMORY APPARATUS HAVING THE SAME, AND OPERATING METHOD THEREOF

(71) Applicant: SK Hynix Inc., Icheon-si Gyeonggi-do (KR)

(72) Inventor: Byeong Cheol Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/173,953

(22) Filed: Feb. 6, 2014

(30) Foreign Application Priority Data

Nov. 29, 2013 (KR) .................. 10-2013-0147763

(51) Int. Cl.
*G11C 7/22* (2006.01)
*G11C 7/12* (2006.01)
*G11C 7/08* (2006.01)

(52) U.S. Cl.
CPC ...... *G11C 7/222* (2013.01); *G11C 7/12* (2013.01); *G11C 7/08* (2013.01)

(58) Field of Classification Search
CPC .................................. G11C 8/08; G11C 7/222
USPC .............................................. 365/194, 230.06
See application file for complete search history.

(56) References Cited

U.S. PATENT DOCUMENTS

| | | | | |
|---|---|---|---|---|
| 5,627,789 A | * | 5/1997 | Kalb, Jr. ........................ | 365/205 |
| 5,949,270 A | * | 9/1999 | Saito .............................. | 327/390 |
| 5,982,698 A | * | 11/1999 | Tsukude ................... | 365/230.03 |
| 6,072,743 A | * | 6/2000 | Amano et al. ........... | 365/230.03 |
| 6,314,029 B1 | * | 11/2001 | Ko et al. ....................... | 365/190 |
| 7,903,160 B2 | * | 3/2011 | Taguchi et al. ............... | 348/308 |
| 8,659,930 B2 | * | 2/2014 | Yim et al. ..................... | 365/148 |

FOREIGN PATENT DOCUMENTS

| KR | 100224691 B1 | 7/1999 |
|---|---|---|
| KR | 100559735 B1 | 3/2006 |

* cited by examiner

*Primary Examiner* — Michael Tran
(74) *Attorney, Agent, or Firm* — William Park & Associates Ltd.

(57) ABSTRACT

A control circuit for a bit-line sense amplifier may include: a bank active signal generator configured to generate an internal active signal and a bank active signal; and a sense amplifier enable signal generator configured to determine a skew in response to the internal active signal, and set an output time of a sense amplifier enable signal by delaying the bank active signal according to the determined skew.

20 Claims, 8 Drawing Sheets

CONTROL CIRCUIT FOR BIT-LINE SENSE AMPLIFIER AND SEMICONDUCTOR MEMORY APPARATUS HAVING THE SAME, AND OPERATING METHOD THEREOF

CROSS-REFERENCES TO RELATED APPLICATION

The present application claims priority under 35 U.S.C. §119(a) to Korean application number 10-2013-0147763, filed on Nov. 29, 2013, in the Korean Intellectual Property Office, which is incorporated herein by reference in its entirety.

BACKGROUND

1. Technical Field

Various embodiments relate to a semiconductor integrated circuit, and more particularly, to a control circuit for a bit-line sense amplifier (BLSA), a semiconductor memory apparatus having the same, and an operating method thereof.

2. Related Art

A semiconductor memory apparatus, or particularly, DRAM uses a bit-line sense amplifier to sufficiently amplify charge stored in a memory cell, when reading information of the memory cell.

Referring to FIG. 1, the control circuit 10 for a bit-line sense amplifier may include a bank active signal generator 101, a sense amplifier enable signal generator 103, a control signal generator 105, and a sense amplifier driver 107.

The bank active signal generator 101 may be configured to generate a bank enable signal BAb for driving a specific bank in response to an active command ACT and a precharge command PCG.

The sense amplifier enable signal generator 103 may be configured to delay the bank enable signal BAb by a preset time and generate a sense amplifier enable signal SAEN.

The control signal generator 105 may be configured to generate sense amplifier driving control signals SAP and SAN in response to the sense amplifier enable signal SAEN.

The sense amplifier driver 107 may be configured to generate sense amplifier power signal RTO and SB in response to the sense amplifier driving control signals SAP and SAN.

Referring to FIG. 2, as an active command ACT synchronized with a clock signal CLK is provided, the bank active signal BAb is activated. Then, a word line enable signal WLEN is activated to apply a preset voltage to a word line. When the word line enable signal WLEN is activated, data stored in a memory cell coupled to the enabled word line is transmitted to a bit line pair BL and BLb, and charge sharing occurs between the bit line pair BL and BLb.

Then, the bit-line sense amplifier amplifies and senses the charge stored in the bit line pair BL and BLb in response to the sense amplifier power signals RTO and SB generated from the control circuit 10 for a bit-line sense amplifier.

Then, as the read command RD is applied, the data sensed through the bit-line sense amplifier is transmitted through a local input/output line.

The time tRCD (RAS to CAS delay) required until the read command RD is provided after the active command ACT is closely related to the time required until a voltage difference between the bit line pair BL and BLb approaches a preset level ΔV after charge sharing is started between the bit line pair BL and BLb by the word line enable signal WLEN, that is, a charge sharing time.

FIGS. 3 and 4 are diagrams for explaining a charge sharing time depending on a read environment.

FIG. 3 illustrates the voltage change of the bit line pair BL and BLb when the bit-line sense amplifier operates at high speed according to PVT (Process Voltage Temperature) variation, and FIG. 4 illustrates the voltage change of the bit line pair BL and BLb when the BLSA operates at low speed.

In the environment where the bit-line sense amplifier operates at high speed, a charge sharing time t1 required until the voltage difference between the bit line pair BL and BLb approaches the preset level ΔV is shorter than a charge sharing time t2 in the environment where the BLSA operates at low speed.

Thus, the time tRCD must be set in such a condition that the operating speed is optimized while the voltage difference between the bit line pair BL and BLb approaches the preset level ΔV.

When the time tRCD is lengthened, the charge sharing time may be increased to secure a sufficient voltage difference ΔV between the bit line pair BL and BLb; but a sensing start time may be delayed. Also, when the time tRCD is shortened, the charge sharing time may be reduced, and charge sharing may not be sufficiently performed. Then, a fail may occur in the bit line sense amplifier.

The charge sharing time may be set to such a level that the voltage difference ΔV between the bit line pair BL and BLb is saturated. In general, the time tRCD may be set on the basis of the charge sharing time under the worst PVT condition that lengthens the charge sharing time, for example, a PVT condition of a low-speed operation transistor, skew, temperature, or low voltage.

That is, in a current semiconductor memory apparatus, the time tRCD is fixed according to the worst PVT condition. However, the fabrication environment and operation environment of the semiconductor memory apparatus are variable, a fail is still likely to occur during a read operation based the fixed time tRCD, and an unnecessary operation time may be required.

SUMMARY

In an embodiment of the present invention, a control circuit for a bit-line sense amplifier may include: a bank active signal generator configured to generate an internal active signal and a bank active signal; and a sense amplifier enable signal generator configured to determine a skew in response to the internal active signal, and set an output time of a sense amplifier enable signal by delaying the bank active signal according to the determined skew.

In an embodiment of the present invention, a semiconductor memory apparatus may include: a bit-line sense amplifier coupled to a memory cell array through a bit line pair and configured to read data of the memory cell array; and a control circuit for a bit-line sense amplifier configured to determine a skew based on an operation environment according to an internal active signal and a bank active signal, set an output time of a sense amplifier enable signal by delaying the bank active signal according to the determined skew, and provide a driving voltage to the bit-line sense amplifier in response to the sense amplifier enable signal.

In an embodiment of the present invention, an operating method of a semiconductor memory apparatus including a control circuit for a bit-line sense amplifier may include the steps of: generating, by the control circuit, an internal active signal and a bank active signal obtained by latching the internal active signal; outputting, by the control circuit, a skew detection signal based on a skew in response to the internal active signal; and delaying, by the control circuit, the bank active signal by a delay time set through the skew detection signal and outputting a sense amplifier enable signal.

In an embodiment of the present invention, a system comprises: a processor; a controller configured to receive a request and a data from the processor; and a memory unit configured to receive the request and the data from the controller, wherein the memory unit comprises: a bank active signal generator configured to generate an internal active signal and a bank active signal; and a sense amplifier enable signal generator configured to determine a skew in response to the internal active signal, and set an output time of a sense amplifier enable signal by delaying the bank active signal according to the determined skew.

BRIEF DESCRIPTION OF THE DRAWINGS

Features, aspects, and embodiments are described in conjunction with the attached drawings, in which.

DETAILED DESCRIPTION

Hereinafter, a control circuit for a bit-line sense amplifier (BLSA), a semiconductor memory apparatus having the same, and an operating method thereof according to the invention will be described below with reference to the accompanying drawings through various embodiments.

Figure 5:
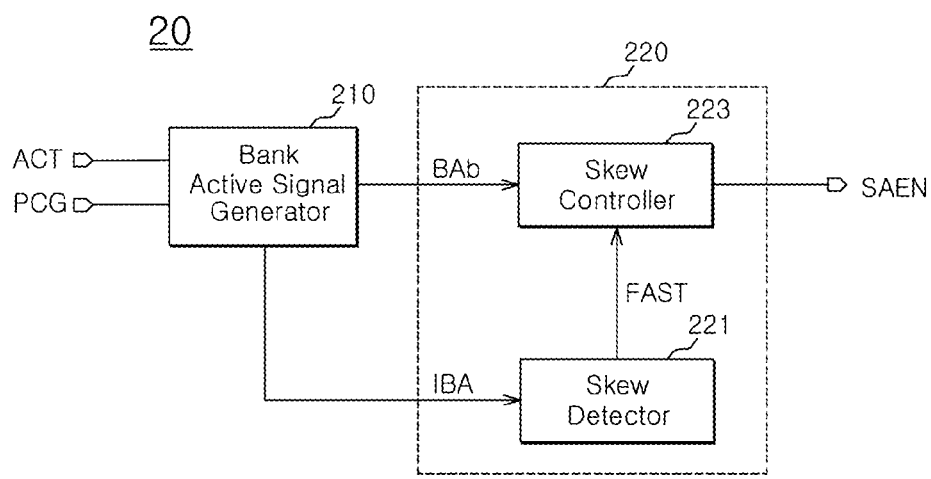
FIG. 5 is a configuration diagram of a control circuit for a bit-line sense amplifier according to an embodiment of the present invention.

Referring to FIG. 5, the control circuit 20 for a bit-line sense amplifier according to an embodiment of the present invention may include a bank active signal generator 210 and a bit-line sense amplifier enable signal generator 220.

The bank active signal generator 210 may be configured to generate an internal active signal IBA and a bank active signal BAb in response to an active command ACT and a precharge command PCG.

Figure 6:
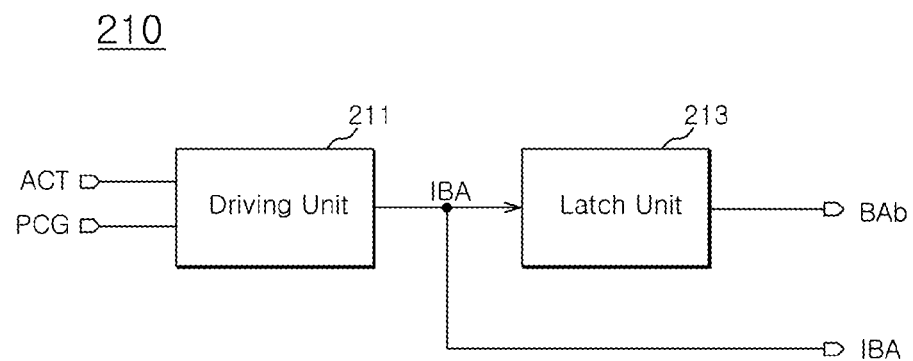
FIG. 6 is a diagram illustrating a bank active signal generator of FIG. 5.

The bank active signal generator 210 may be configured as illustrated in FIG. 6.

Referring to FIG. 6, the bank active signal generator 210 may include a driving unit 211 and a latch unit 213. The driving unit 211 may be configured to generate the internal active signal IBA in response to the active command ACT and the precharge command PCG; and the latch unit 213 may be configured to latch the internal active signal IBA and output the bank active signal BAb.

The bank active signal generator 210 may be designed in various types according to a well-known method. Thus, the detailed descriptions thereof are omitted herein.

Referring again to FIG. 5, the sense amplifier enable signal generator 220 may be configured to determine a skew depending on the operation environment of the semiconductor memory apparatus in response to the internal active signal IBA; and set an output time of a sense amplifier enable signal SAEN according to the determined skew.

The sense amplifier enable signal generator 220 may include a skew detector 221 and a skew controller 223.

The skew detector 221 may be configured to detect a skew depending on the operation environment of the semiconductor memory apparatus, for example, a speed in response to the internal active signal IBA, and output a skew detection signal FAST.

The skew controller 223 may be configured to receive the bank active signal BAb, delay the bank active signal BAb according to the skew detection signal FAST, and output the delayed signal as the sense amplifier enable signal SAEN.

Figure 7:
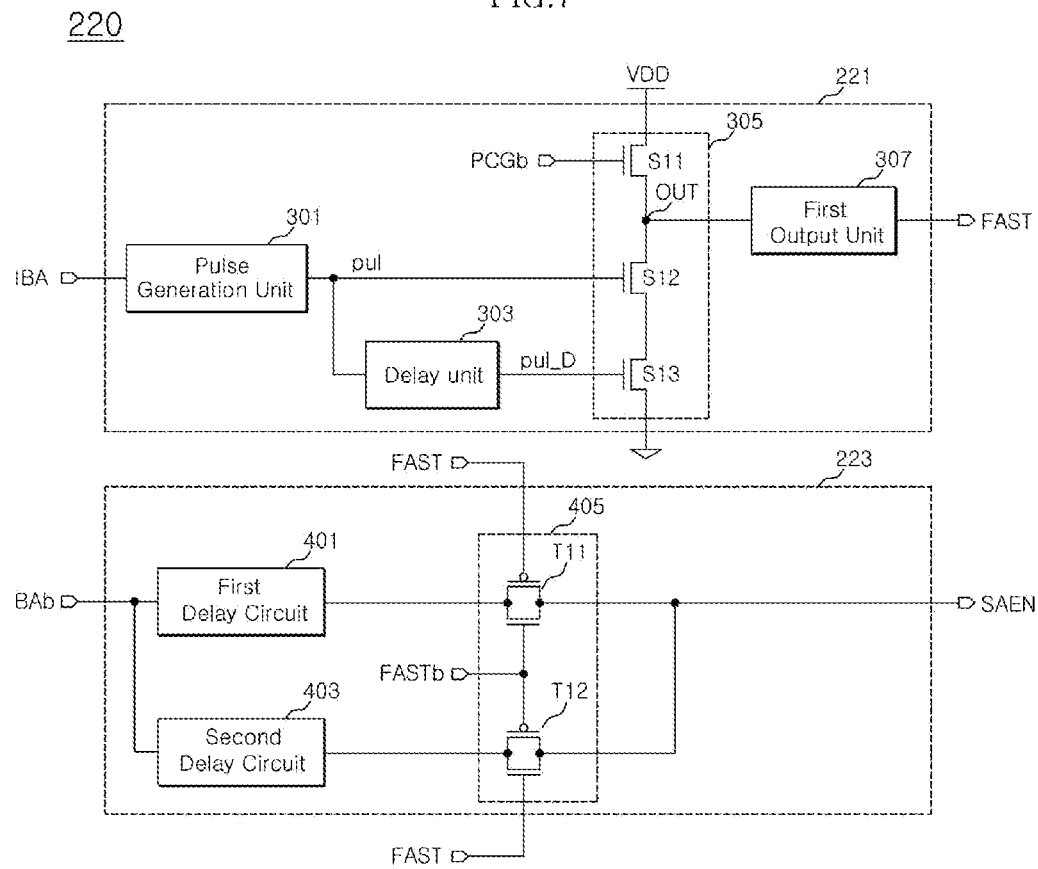
FIG. 7 is a diagram illustrating a sense amplifier enable signal generator of FIG. 5.

The sense amplifier enable signal generator 220 may be configured as illustrated in FIG. 7.

Referring to FIG. 7, the skew detector 221 may include a pulse generation unit 301, a delay unit 303, a skew determination unit 305, and a first output unit 307.

The pulse generation unit 301 may be configured to receive the internal active signal IBA and generate a pulse signal pul.

Figure 8:
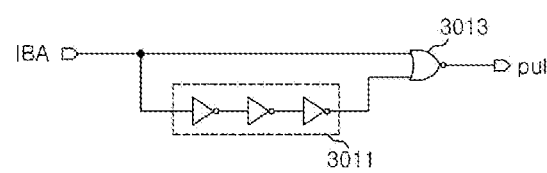
FIG. 8 is a diagram illustrating a pulse generation unit of FIG. 5.

The pulse generation unit 301 may be configured as illustrated in FIG. 8. That is, the pulse generation unit 301 may include a delay element 3011 and a logical element 3013. The delay element 3011 may be configured to invert and delay the internal active signal IBA; and the logical element 3013 may be configured to output the pulse signal pul which pulses at a high level when both of the internal active signal IBA and the inverted and delayed internal active signal IBA are at a low level. However, the invention is not limited thereto.

Referring again to FIG. 7, the delay unit 303 may be configured to delay the pulse signal pul generated by the pulse generation unit 301 and generate the delayed pulse signal pul_D. In an embodiment of the present invention, the delay unit 303 may delay the pulse signal pul such that the phase of the pulse signal pul is not changed. Furthermore, the delay unit 303 may model a skew depending on the operation environment of the semiconductor memory apparatus; and output the delayed pulse signal pul_D whose delay time is varied according to the skew. Thus, in the environment where the semiconductor memory apparatus operates at high speed, the delay unit 303 may output a delayed pulse signal pul_D having no delay time or a slight delay time. On the other hand, in the environment where the semiconductor memory apparatus at low speed, the delay unit 303 may output a delayed pulse signal pul_D having a long delay time.

The skew determination unit 305 may be configured to determine a skew in response to a precharge command PCGb, the pulse signal pul, and the delayed pulse signal pul_D. For this operation, the skew determination unit 305 may include a first switching element S11, a second switching element S12, and a third switching element S13. The first switching element S11 may be coupled between a power supply voltage terminal VDD and an output node OUT and driven in response to the precharge command PCGb; the second switching element S12 may be coupled to the first switching element S11 and driven in response to the pulse signal pul; and the third switching element S13 may be coupled between the second switching element S12 and a ground terminal VSS and driven in response to the delayed pulse signal pul_D.

The precharge signal PCG may have a low level when the active command ACT is activated. Thus, the first switching element S11 driven by the inverted precharge signal PCGb may be turned on during an active operation.

The second switching element S12 may be driven by the pulse signal pul, and the third switching element S13 may be driven by the delayed pulse signal pul_D. Thus, in the environment where the semiconductor memory apparatus operates at high speed, the pulse signal pul and the delayed pulse signal pul_D may turn on the second and third switching elements S12 and S13 at substantially the same time; and a low-level signal may be applied to the output node OUT.

In the environment where the semiconductor memory apparatus operates at low speed, the delayed pulse signal pul_D may not turn on the third switching element S13 in a state where the second switching element S12 is turned on in response to the pulse signal pul. Thus, a high-level signal may be applied to the output node OUT.

The first output unit 307 may be configured to invert and latch the voltage level of the output node OUT and output the skew detection signal FAST. Thus, in the environment where the semiconductor memory apparatus operates at high speed, the skew detection signal FAST may be outputted at a high level; and in the environment where the semiconductor memory apparatus operates at low speed, the skew detection signal FAST may be outputted at a low level. The first output unit 307 may be configured to output a signal applied to the output node OUT of the skew determination unit 305 as the skew detection signal FAST.

The skew controller 223 may include a first delay circuit 401, a second delay circuit 403, and a second output unit 405.

The first delay circuit 401 may be configured to receive the bank active signal BAb and delay the received signal by a first delay time. The second delay circuit 403 may be configured to receive the bank active signal BAb and delay the received signal by a second delay time. In an embodiment of the present invention, the delay time of the delay time of the first delay circuit 401 may be designed to be shorter than that of the second delay circuit 403.

The second output unit 405 may be configured to drive an output signal of the first delay circuit 401 and output the driven signal as the sense amplifier enable signal SAEN in response to the skew detection signal FAST; or drive an output signal of the second delay circuit 403 and output the driven signal as the sense amplifier enable signal SAEN in response to the skew detection signal FAST. FIG. 7 also illustrates skew detection signal FASTb.

For this operation, the second output unit 405 may include a first transmission element T11 and a second transmission element T12. The first transmission element T11 may be configured to drive the output signal of the first delay circuit 401 in response to the skew detection signal FAST; and the second transmission element T12 may be configured to drive the output signal of the second delay circuit 403 in response to the skew detection signal FAST.

When the semiconductor memory apparatus operates at high speed due to the process environment or external environment, the skew detection signal FAST may be outputted at a high level to thereby operate the second transmission element T12. Then, the bank active signal BAb may be delayed by the second delay time through the second delay circuit 403 and then outputted as the sense amplifier enable signal SAEN. On the other hand, when the semiconductor memory apparatus operates at low speed, the skew detection signal FAST may be outputted at a low level to thereby drive the first transmission element T11. Then, the bank active signal BAb may be delayed by the first delay time shorter than the second delay time through the first delay circuit 401 and then outputted as the sense amplifier enable signal SAEN.

Figure 9:
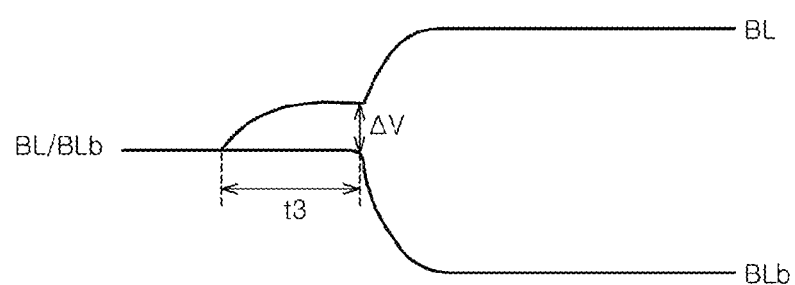
FIGS. 9 and 10 are diagrams for explaining a charge sharing time during a read operation using the control circuit for a bit-line sense amplifier according to an embodiment of the present invention.
Figure 10:
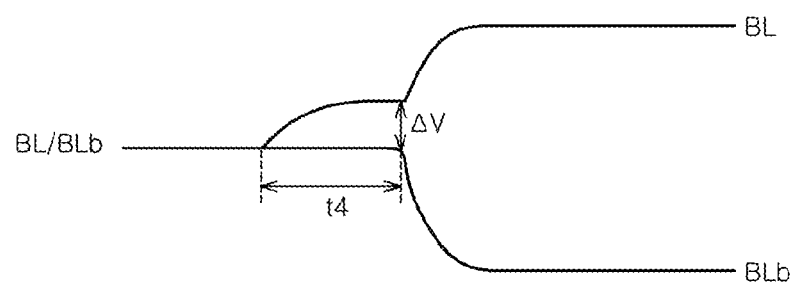

FIG. 9 illustrates the voltage change of the bit line pair BL and BLb when the semiconductor memory apparatus operates at high speed; and FIG. 10 illustrates the voltage change of the bit line pair BL and BLb when the semiconductor memory apparatus operates at low speed.

The skew detection signal FAST generated through the configuration illustrated in FIGS. 5 to 7 may lengthen the delay time of the bank active signal BAb to delay the activation time of the sense amplifier enable signal SAEN when the semiconductor memory apparatus operates at high speed; and may shorten the delay time of the bank active signal BAb to advance the activation time of the sense amplifier enable signal SAEN when the semiconductor memory apparatus operates at low speed.

Thus, as illustrated in FIGS. 9 and 10, charge sharing times t3 and t4 in the high-speed environment and the low-speed environment may be controlled to almost the same value, or desirably, the same value.

Figure 11:
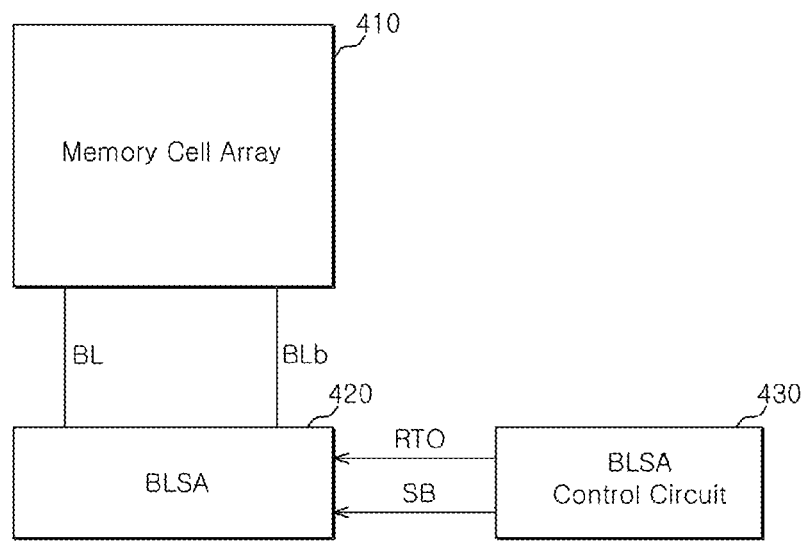
FIG. 11 is a configuration diagram of a semiconductor memory apparatus according to an embodiment of the present invention.

The semiconductor memory apparatus 40 may include a cell array 410, a bit-line sense amplifier (BLSA) 420, and a control circuit 430 for a bit-line sense amplifier 420. The cell array 410 may include a plurality of memory cells coupled between word lines and bit lines. The bit-line sense amplifier 420 may be coupled to the cell array 410 through a bit line pair BL and BLb so as to write data to a memory cell or read data stored in a memory cell. The control circuit 430 for a bit line sense amplifier may be configured to provide a driving voltage to the bit-line sense amplifier 420 during a read operation. FIG. 11 also illustrates sense amplifier power signals RTO and SB.

Figure 1:
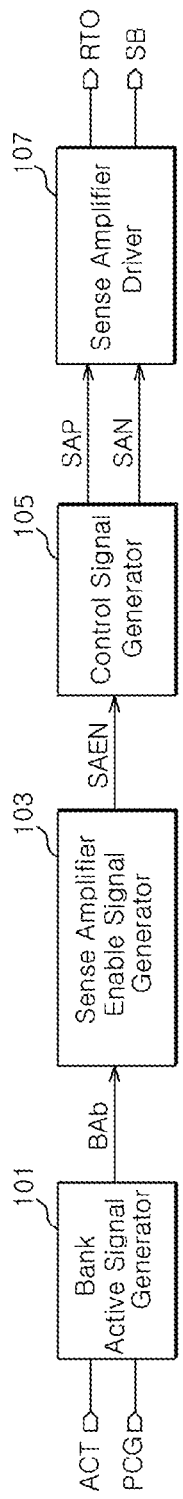
FIG. 1 is a configuration diagram of a conventional control circuit for a bit-line sense amplifier.
Figure 2:
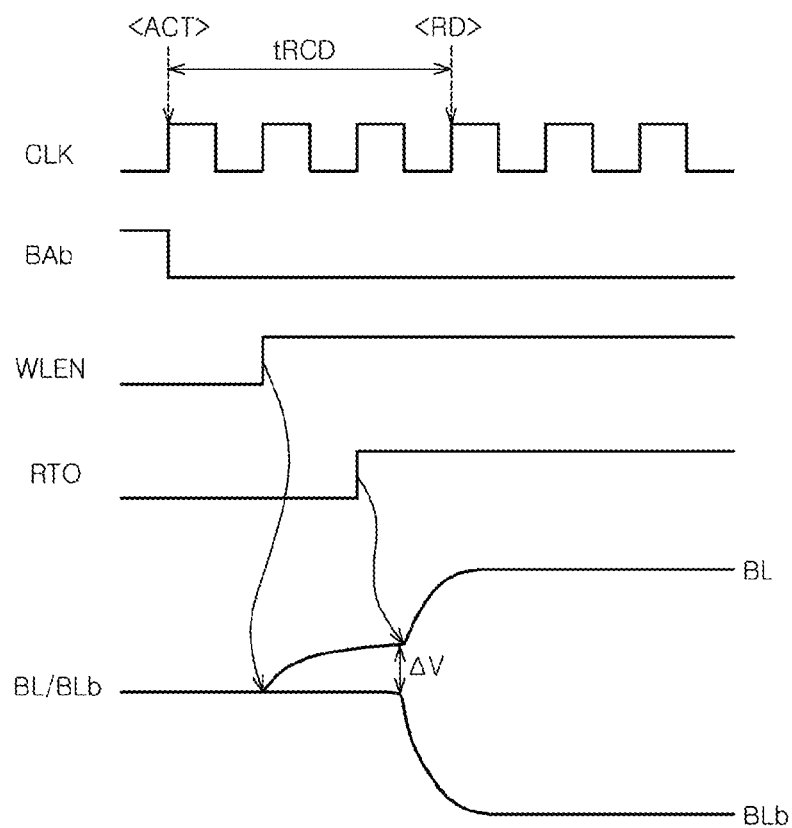
FIG. 2 is a timing diagram for explaining a read operation of a conventional semiconductor memory apparatus.
Figure 3:
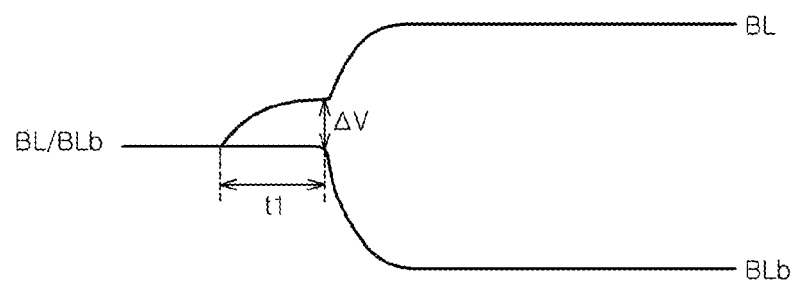
FIGS. 3 and 4 are diagrams for explaining a charge sharing time depending on a read environment.
Figure 4:
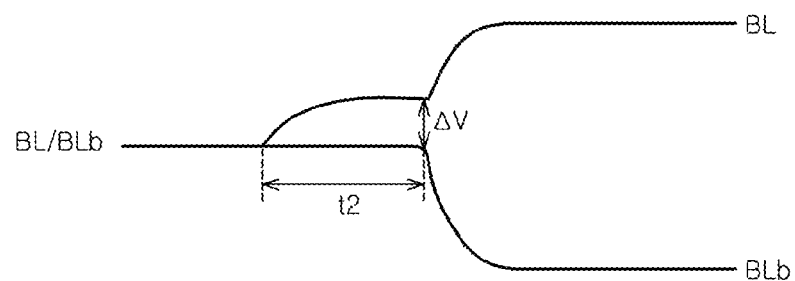

The control circuit 430 for a bit-line sense amplifier may include a bank active signal generator, a sense amplifier enable signal generator, a control signal generator, and a sense amplifier driver, as illustrated in FIG. 1. Furthermore, the bank active signal generator and the sense amplifier enable signal generator may be configured as illustrated in FIGS. 5 to 7. The control circuit 430 for the bit-line sense amplifier 420 may be configured to determine a skew based on an operation environment according to the internal active signal IBA and bank active signal BAb which are generated in response to an active command ACT and a precharge command PCG; set an output time of the sense amplifier enable signal SAEN by delaying the bank active signal BAb according to the determined skew; and provide a driving voltage to the bit-line sense amplifier 420 in response to the sense amplifier enable signal SAEN during a read operation.

That is, the semiconductor memory apparatus according to an embodiment of the present invention may vary the delay time of the bank active signal according to the operation environment of the semiconductor memory apparatus, for example, the speed of the semiconductor memory apparatus, when generating the sense amplifier enable signal by delaying the bank active signal.

The semiconductor memory apparatus 40 according to an embodiment of the present invention may operate in the following manner during a read mode.

According to an active command, the bank active signal generator 210 may latch the internal active signal IBA and generate the bank active signal BAb. As the internal active signal IBA is generated, the skew detector 221 of the sense amplifier enable signal generator 220 may determine the operating speed of the semiconductor memory apparatus and output the skew detection signal FAST in response to the internal active signal IBA. The control circuit 430 may be configured to generate the internal active signal IBA and the bank active signal BAb by latching the internal active signal IBA according to the active command. Furthermore, the skew controller 223 of the sense amplifier enable signal generator 220 may receive the bank active signal BAb, delay the bank active signal BAb by a delay time selected through the skew detection signal FAST, and output the sense amplifier enable signal SAEN. Accordingly, the bank active signal generator 210 may be configured to generate the internal active signal IBA and the bank active signal Bab in response to the active command ACT and the precharge command PCGb. The control circuit 430 may be configured to output the skew detection signal FAST based on a skew of the semiconductor memory apparatus in response to the internal active signal IBA.

In order to output the skew detection signal FAST, the skew detector 221 may generate the pulse signal pul from the internal active signal IBA, delay the pulse signal pul to model skew of the semiconductor apparatus, and output the delayed pulse signal pul_D. Furthermore, the skew detector 332 may determine a skew in response to the precharge command PCGb, the pulse signal pul, and the delayed pulse signal pul_D and output the skew detection signal FAST. The sense amplifier enable signal generator 220 may be configured to determine the skew in response to the internal active signal IBA, and set an output time of the sense amplifier enable signal SAEN according to the determined skew.

Figure 12:
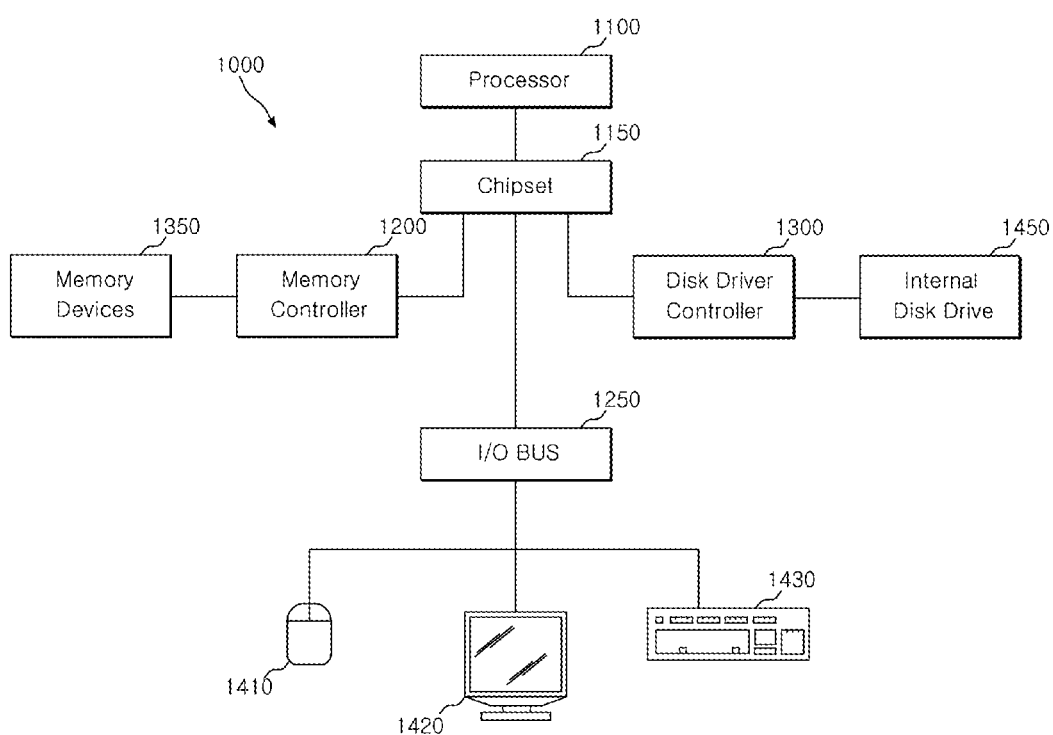
FIG. 12 illustrates a block diagram of a system employing a memory controller circuit in accordance with an embodiment of the present invention.

Referring to FIG. 12 a system 100 may include one or more processors 1100. A chipset 1150 may be operably coupled to the processor 1100. The chipset 1150 is a communication pathway for signals between the processor 1100 and other components of the system 1000, which may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably coupled to the chipset 1150. The memory controller 1200 can receive a request provided from the processor 1100, through the chipset 1150. The memory controller 1200 may be operably coupled to one or more memory devices 1350. The memory devices 1350 can correspond to the semiconductor memory apparatus described above.

The chipset 1150 may also be coupled to the I/O bus 1250. The I/O bus 1250 may serve as a communication pathway for signals from the chipset 1150 to the I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be operably coupled to the chipset 1150. The disk drive controller 1300 may serve as the communication pathway between the chipset 1150 and one or more internal disk drives 1450. The disk drive controller 1300 and the internal disk drives 1450 may communication with each other or with the chipset 1150 using virtually any type of communication protocol, including all of those mentioned above with regard to the I/O bus 1250.

Thus, the semiconductor memory apparatus according to an embodiment of the present invention may operate adaptively to the external environment.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A control circuit for a bit-line sense amplifier, comprising:
   a bank active signal generator configured to generate an internal active signal and a bank active signal; and
   a sense amplifier enable signal generator configured to determine a skew in response to the internal active signal, and set an output time of a sense amplifier enable signal by delaying the bank active signal according to the determined skew.

2. The control circuit according to claim 1, wherein the bank active signal generator comprises:
   a driving unit configured to generate the internal active signal in response to an active command and a precharge command; and
   a latch unit configured to latch the internal active signal and output the bank active signal.

3. The control circuit according to claim 1, wherein the sense amplifier enable signal generator comprises:
   a skew detector configured to detect the skew in response to the internal active signal and output a skew detection signal; and
   a skew controller configured to receive the bank active signal and output the sense amplifier enable signal by delaying the bank active signal according to the skew detection signal.

4. The control circuit according to claim 3, wherein the skew detector comprises:
   a pulse generation unit configured to receive the internal active signal and generate a pulse signal;
   a delay unit configured to delay the pulse signal and output the delayed pulse signal;
   a skew determination unit configured to determine the skew in response to the precharge command, the pulse signal, and the delayed pulse signal; and
   a first output unit configured to output a signal applied to an output node of the skew determination unit as the skew detection signal.

5. The control circuit according to claim 4, wherein the delay unit delays the pulse signal such that the phase of the pulse signal is maintained.

6. The control circuit according to claim 4, wherein the delay unit varies a delay time of the delayed pulse signal according to the skew.

7. The control circuit according to claim 4, wherein the skew determination unit comprises:
   a first switching element coupled between a power supply voltage terminal and the output node and driven in response to the precharge command;
   a second switching element coupled to the first switching element and driven in response to the pulse signal; and
   a third switching element coupled between the second switching element and a ground terminal and driven in response to the delayed pulse signal.

8. The control circuit according to claim 4, wherein the skew controller comprises:
   a first delay circuit configured to delay the bank active signal by a first delay time;
   a second delay circuit configured to delay the bank active signal by a second delay time; and
   a second output unit configured to output an output signal of the first delay circuit or an output signal of the second delay circuit as the sense amplifier enable signal in response to the skew detection signal.

9. A semiconductor memory apparatus comprising:
a bit-line sense amplifier coupled to a memory cell array through a bit line pair and configured to read data of the memory cell array; and
a control circuit for a bit-line sense amplifier configured to determine a skew based on an operation environment according to an internal active signal and a bank active signal, set an output time of a sense amplifier enable signal by delaying the bank active signal according to the determined skew, and provide a driving voltage to the bit-line sense amplifier in response to the sense amplifier enable signal.

10. The semiconductor memory apparatus according to claim 9, wherein the control circuit for a bit-line sense amplifier comprises:
a bank active signal generator configured to generate the internal active signal and the bank active signal in response to an active command and a precharge command; and
a sense amplifier enable signal generator configured to determined the skew in response to the internal active signal, and set an output time of a sense amplifier enable signal according to the determined skew.

11. The semiconductor memory apparatus according to claim 10, wherein the bank active signal generator comprises:
a driving unit configured to generate the internal active signal in response to the active command and the precharge command; and
a latch unit configured to latch the internal active signal and output the bank active signal.

12. The semiconductor memory apparatus according to claim 10, wherein the sense amplifier enable signal generator comprises:
a skew detector configured to determine the skew in response to the internal active signal and output a skew detection signal; and
a skew controller configured to receive the bank active signal and output the sense amplifier enable signal by delaying the bank active signal according to the skew detection signal.

13. The semiconductor memory apparatus according to claim 12, wherein the skew detector comprises:
a pulse generation unit configured to receive the internal active signal and generate a pulse signal;
a delay unit configured to delay the pulse signal and output the delayed pulse signal;
a skew determination unit configured to determine the skew in response to the precharge command, the pulse signal, and the delayed pulse signal; and
a first output unit configured to output a signal applied to an output node of the skew determination unit as the skew detection signal.

14. The semiconductor memory apparatus according to claim 13, wherein the delay unit varies a delay time of the delayed pulse signal according to the skew.

15. The semiconductor memory apparatus according to claim 13, wherein the skew controller comprises:
a first delay circuit configured to delay the bank active signal by a first delay time;
a second delay circuit configured to delay the bank active signal by a second delay time; and
a second output unit configured to output an output signal of the first delay circuit or an output signal of the second delay circuit as the sense amplifier enable signal in response to the skew detection signal.

16. An operating method of a semiconductor memory apparatus including a control circuit for a bit-line sense amplifier, comprising the steps of:
generating, by the control circuit, an internal active signal and a bank active signal obtained by latching the internal active signal;
outputting, by the control circuit, a skew detection signal based on a skew in response to the internal active signal; and
delaying, by the control circuit, the bank active signal by a delay time set through the skew detection signal and outputting a sense amplifier enable signal.

17. The operating method according to claim 16, wherein the step of outputting the skew detection signal comprises the steps of:
generating a pulse signal from the internal active signal;
delaying the pulse signal according to the skew and outputting the delayed pulse signal; and
determining the skew in response to the pulse signal and the delayed pulse signal and outputting the skew detection signal.

18. The semiconductor memory apparatus of claim 12, wherein the skew detector is configured to detect the skew based on a speed in response to the internal active signal.

19. The semiconductor memory apparatus according to claim 13, wherein the first output unit is configured to invert and latch a voltage level of the output node to output the skew detection signal.

20. The semiconductor memory apparatus of claim 15, wherein the second output unit comprises:
a first transmission element configured to drive the output signal of the first delay circuit in response to the skew detection signal; and
a second transmission element configured to drive the output signal of the second delay circuit in response to the skew detection signal.

* * * * *